(12) United States Patent
Diodà et al.

(10) Patent No.: US 10,378,121 B2
(45) Date of Patent: Aug. 13, 2019

(54) CRYSTAL PULLING SYSTEM AND METHOD FOR INHIBITING PRECIPITATE BUILD-UP IN EXHAUST FLOW PATH

(71) Applicant: SunEdison Semiconductor Limited (UEN201334164H), Singapore (SG)

(72) Inventors: Mauro Diodà, Bolzano (IT); Marco D'Angella, Merano (IT); Hariprasad Sreedharamurthy, Ballwin, MO (US)

(73) Assignee: GlobalWafers Co., Ltd., Taiwan (TW)

( * ) Notice: Subject to any disclaimer, the term of this patent is extended or adjusted under 35 U.S.C. 154(b) by 0 days.

(21) Appl. No.: 15/358,589

(22) Filed: Nov. 22, 2016

(65) Prior Publication Data

US 2017/0145587 A1 May 25, 2017

Related U.S. Application Data

(60) Provisional application No. 62/259,492, filed on Nov. 24, 2015.

(51) Int. Cl.
| | |
|---|---|
| *C30B 25/14* | (2006.01) |
| *C30B 15/00* | (2006.01) |
| *C30B 29/06* | (2006.01) |
| *C30B 35/00* | (2006.01) |
| *C23C 16/44* | (2006.01) |

(52) U.S. Cl.
CPC .......... *C30B 15/00* (2013.01); *C23C 16/4411* (2013.01); *C30B 25/14* (2013.01); *C30B 29/06* (2013.01); *C30B 35/00* (2013.01); *Y10T 117/1032* (2015.01)

(58) Field of Classification Search
CPC ......... C30B 29/06; C30B 25/14; C30B 35/00; C23C 16/4411; Y10T 117/1032
See application file for complete search history.

(56) References Cited

U.S. PATENT DOCUMENTS

| 4,343,772 | A | * | 8/1982 | Frosch | B01J 6/008 |
| | | | | | 422/200 |
| 5,573,591 | A | | 11/1996 | Ikezawa et al. | |
| 5,993,902 | A | | 11/1999 | Heid | |
| 6,254,673 | B1 | * | 7/2001 | Johnson | C30B 15/00 |
| | | | | | 117/13 |
| 6,488,768 | B1 | | 12/2002 | Nettleton | |
| 6,503,322 | B1 | * | 1/2003 | Schrenker | C30B 15/14 |
| | | | | | 117/204 |
| 8,753,466 | B2 | | 6/2014 | Noda et al. | |
| 2008/0110394 | A1 | * | 5/2008 | Noda | C30B 15/00 |
| | | | | | 117/88 |

(Continued)

FOREIGN PATENT DOCUMENTS

| JP | S5441280 A | 4/1979 |
| JP | H05117075 A | 5/1993 |

(Continued)

*Primary Examiner* — Matthew J Song
(74) *Attorney, Agent, or Firm* — Armstrong Teasdale LLP (57) ABSTRACT

A crystal pulling system for growing a monocrystalline ingot from a melt of semiconductor or solar-grade material includes a housing defining a growth chamber, a crucible disposed within the growth chamber containing the melt of semiconductor or solar-grade material, a vacuum pump for drawing exhaust gases out of the growth chamber, and a fluid-cooled exhaust tube connected between the growth chamber and the vacuum pump.

21 Claims, 5 Drawing Sheets

(56) References Cited

U.S. PATENT DOCUMENTS

| | | | | |
|---|---|---|---|---|
| 2009/0249998 | A1* | 10/2009 | Inami | C30B 15/14 117/217 |
| 2010/0050393 | A1* | 3/2010 | Clark | C30B 28/04 23/300 |
| 2012/0114531 | A1* | 5/2012 | Higuchi | C30B 15/00 422/170 |
| 2013/0149226 | A1* | 6/2013 | Song | F25J 3/08 423/262 |
| 2013/0315789 | A1* | 11/2013 | Carlson | B01D 53/007 422/168 |
| 2015/0011076 | A1* | 1/2015 | Demars | H01L 21/67017 438/478 |

FOREIGN PATENT DOCUMENTS

| | | | | |
|---|---|---|---|---|
| JP | H05254982 | A | | 10/1993 |
| JP | H07223894 | A | | 8/1995 |
| JP | 09002892 | A | * | 1/1997 ............ C30B 15/00 |
| JP | H092892 | A | | 1/1997 |
| JP | 2004137089 | A | | 5/2004 |
| WO | 2014178598 | A1 | | 11/2014 |

* cited by examiner

CRYSTAL PULLING SYSTEM AND METHOD FOR INHIBITING PRECIPITATE BUILD-UP IN EXHAUST FLOW PATH

CROSS-REFERENCE TO RELATED APPLICATIONS

This application claims priority to U.S. Provisional Patent Application Ser. No. 62/259,492, filed Nov. 24, 2015, the disclosure of which is hereby incorporated by reference in its entirety.

FIELD

The field relates generally to preparation of single crystals of semiconductor or solar-grade material and, more specifically, to crystal pulling systems including a fluid-cooled exhaust tube for reducing and/or preventing the build-up of precipitates along an exhaust flow path of the system.

BACKGROUND

Single crystal material, which is the starting material for fabricating many electronic components such as semiconductor devices and solar cells, is commonly prepared using the Czochralski ("CZ") method. Briefly, the Czochralski method involves melting polycrystalline source material, such as polycrystalline silicon ("polysilicon"), in a crucible to form a silicon melt, and then pulling a single-crystal ingot from the melt.

The Czochralski growth process is typically carried out in a sealed or enclosed housing with a controlled, inert gas flow to inhibit dust and other airborne particles from contaminating the melt. The inert gas flow is also used to evacuate gaseous products (e.g., SiO, CO, etc.) generated from reactions between the melt, the crucible, and/or the susceptor during the growth process. As gaseous products are carried away from the melt and the hot zone (e.g., heater and the crucible), the gaseous products cool and deposit and form precipitates on components of the crystal puller, often in the form of silicon carbide. Such precipitates can form blockages in a gas exhaust port of the crystal puller, resulting in reduced exhaust gas flow, increased pressure, and potential loss of zero-dislocation growth or run failures.

Known methods and crystal pulling systems for addressing and/or reducing precipitate buildup are less than optimal for certain applications. For example, current methods for addressing precipitate buildup in crystal pullers include frequently cleaning the crystal puller components, applying chemical barriers or coatings to components to inhibit deposition of gaseous products, and maintaining the exhaust port and related components at elevated temperatures to prevent condensation and precipitation of gaseous products. However, such methods typically result in significant downtime of the crystal puller, thereby decreasing throughput of crystal puller, and/or are costly and complex to implement in existing crystal pullers. Accordingly, a need exists for crystal pulling systems and methods for inhibiting precipitate build-up in the exhaust flow path of crystal pulling systems.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a crystal pulling system for growing a monocrystalline ingot from a melt of semiconductor or solar-grade material includes a housing defining a growth chamber and a crucible disposed within the growth chamber for containing the melt of semiconductor or solar-grade material. An exhaust tube connected to and extending outward from a sidewall of the housing defines an exhaust flow path for discharging gaseous products from the growth chamber. A vacuum pump is connected in fluid communication with the exhaust tube and is configured to draw exhaust gases through the exhaust flow path. The exhaust tube includes an inner wall, an outer wall, and a fluid passage defined between the inner wall and the outer wall. The fluid passage is configured to receive fluid for cooling exhaust gases within the exhaust flow path.

In another aspect, a crystal pulling system for growing a monocrystalline ingot from a melt includes a housing defining a growth chamber, a crucible disposed within the growth chamber for containing the melt of semiconductor or solar-grade material, a vacuum pump configured to draw exhaust gases out of the growth chamber, and a fluid-cooled exhaust tube connected in fluid communication between the growth chamber and the vacuum pump.

In yet another aspect, a method of growing a monocrystalline ingot is carried out in a crystal growing system including a housing defining a growth chamber and a crucible disposed within the growth chamber for containing a melt of semiconductor or solar-grade material. The method includes preparing the melt in the crucible, introducing an inert gas into the growth chamber, directing the inert gas through the growth chamber to remove gaseous products generated within the growth chamber, discharging the gaseous products through an exhaust tube connected to and extending outward from a sidewall of the housing, and cooling the gaseous products as the gaseous products flow through the exhaust tube.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Example systems and methods described herein enable longer run times in crystal pulling systems used to grow monocrystalline ingots. Example embodiments of the systems and methods reduce or prevent the build-up of deposits and precipitates within the exhaust tube of crystal pulling systems, thereby preventing blockage of the exhaust flow path, preventing reduction in exhaust flow, and preventing increases in pressure within the crystal pulling system. Embodiments disclosed include a fluid-cooled exhaust tube that rapidly cools exhaust gases as they pass through the exhaust tube. Rapidly cooling exhaust gases, as compared to maintaining exhaust gases at an elevated temperature, results in the formation of precipitates having a powder-like structure or morphology that does not adhere to surfaces of the exhaust tube as strongly as precipitates formed at higher temperatures (e.g., near a condensation or precipitation temperature). As a result, precipitates formed within the fluid-cooled exhaust tubes have a tendency to not aggregate or build-up within the exhaust flow path, allowing crystal growth processes to be carried out for extended periods of time.

Figure 1:
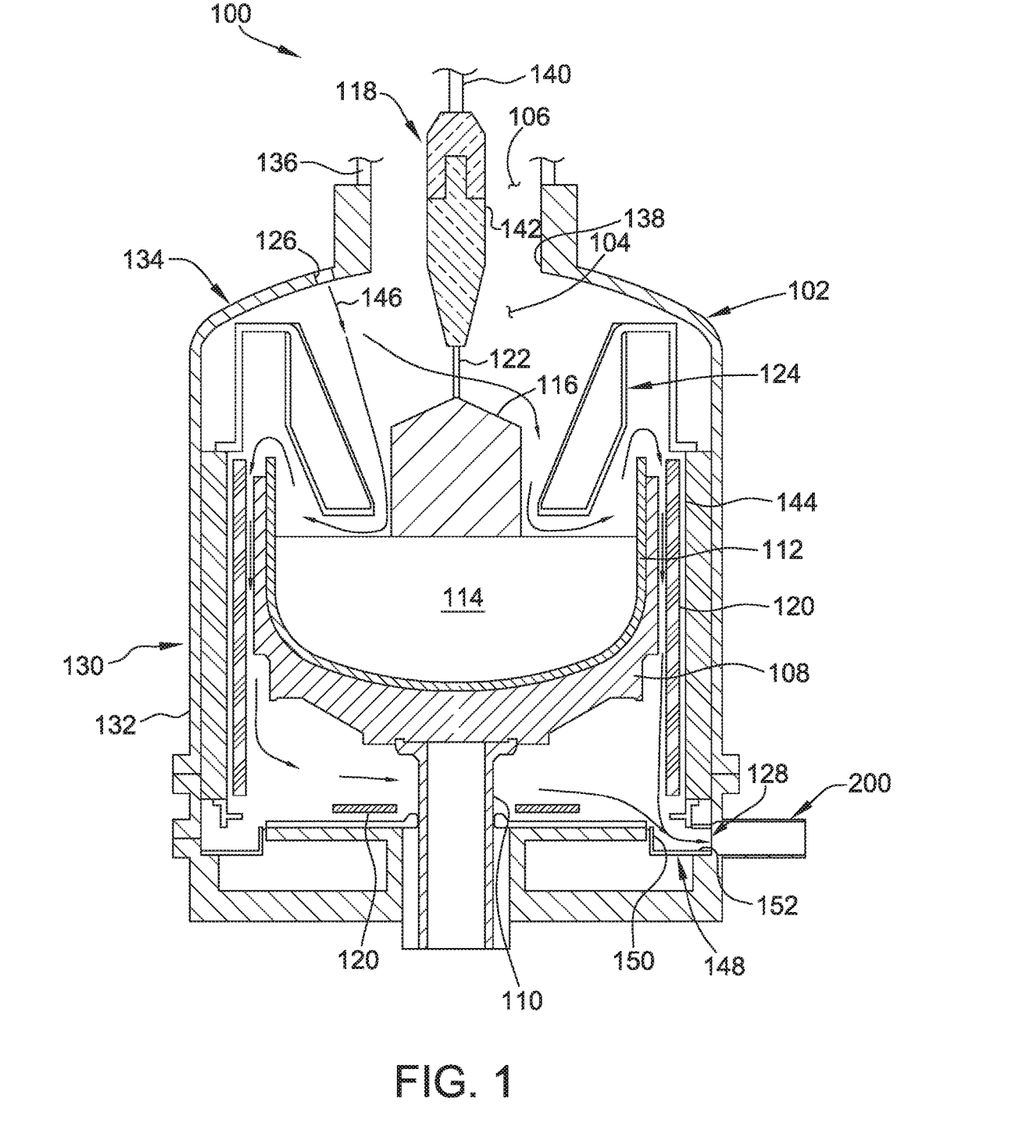
FIG. 1 is a partially schematic section view of an example crystal pulling system including a fluid-cooled exhaust tube.

Referring to FIG. 1, a crystal pulling system is shown schematically and is indicated generally at 100. The crystal pulling system 100 is used to produce monocrystalline (i.e., single crystal) ingots of semiconductor or solar-grade material (e.g., silicon) by the Czochralski (CZ) method. The illustrated crystal pulling system 100 is configured for growing ingots in a batch or recharge CZ method, although the systems and methods disclosed herein may be used to grow monocrystalline ingots by a continuous CZ method.

The illustrated crystal pulling system 100 generally includes a housing 102 defining a growth chamber 104 and an ingot removal chamber 106 connected to and positioned above the growth chamber 104. A graphite support or susceptor 108 is supported by a rotatable shaft 110 within the growth chamber 104. A crucible 112 containing a melt 114 of semiconductor or solar-grade material (e.g., silicon) from which a monocrystalline ingot 116 is pulled by a pulling mechanism 118 is supported within the growth chamber 104 by the susceptor 108. One or more heaters 120 are positioned proximate the susceptor 108 and/or crucible 112 for supplying thermal energy to the system 100. During the crystal growth process, a seed crystal 122 is lowered by the pulling mechanism 118 into contact with the melt 114 and then slowly raised from the melt 114. As the seed crystal 122 is slowly raised from the melt 114, atoms from the melt 114 align themselves with and attach to the seed crystal 122 to form the ingot 116. The system also includes a heat shield 124 configured to shield the ingot 116 from radiant heat from the melt 114 to allow the ingot 116 to solidify.

The crystal pulling system 100 also includes a gas inlet 126 for introducing an inert gas into the growth chamber 104, and an exhaust outlet 128 for discharging the inert gas and other gaseous and airborne particles from the growth chamber 104. A fluid-cooled exhaust tube 200 is connected to the housing 102 at the exhaust outlet 128, and is configured to rapidly cool exhaust gases discharged from the growth chamber 104 during the Czochralski growth process. As described in more detail herein, the fluid-cooled exhaust tube 200 prevents build-up of deposits and precipitates within the exhaust tube 200, and thereby facilities longer run times and higher throughput.

The housing 102 includes a lower portion 130 including an annular sidewall 132, an upper dome 134 connected to the lower portion 130, and an elongate tubular portion 136 extending generally upward from the upper dome 134. The growth chamber 104 is defined by the lower portion 130 and the upper dome 134, and the ingot removal chamber 106 is generally defined by the elongate tubular portion 136. The upper dome 134 includes a central annular opening 138 through which the ingot 116 is pulled into the ingot removal chamber 106. The housing 102 may be made of stainless steel or other suitable materials. In some embodiments, one or more of the lower portion 130, the upper dome 134, and the tubular portion 136 may include fluid-cooled (e.g., water-cooled) stainless steel walls.

The crucible 112 is positioned within the growth chamber 104 and beneath the removal chamber 106 such that the ingot 116 can be pulled by the crystal pulling mechanism 118 through the central opening 138 in the upper dome 134 and into the removal chamber 106. The crucible 112 may be made of, for example, quartz or any other suitable material that enables the crystal pulling system 100 to function as described herein. Further, the crucible 112 may have any suitable size that enables the crystal pulling system 100 to function as described herein.

The heat shield 124 is positioned adjacent the crucible 112, and separates the melt 114 from an upper portion of the system 100. The heat shield 124 is configured to shield the ingot 116 from radiant heat generated by the melt 114 and the heaters 120 to allow the ingot 116 to solidify. In the example embodiment, the heat shield 124 includes a conical member separating the melt 114 from an upper portion of the system 100, and a central opening defined therein to allow the ingot 116 to be pulled therethrough. In other embodiments, the heat shield 124 may have any suitable configuration that enables the system 100 to function as described herein. In the example embodiment, the heat shield 124 is constructed from graphite. In other embodiments, the heat shield 124 may be constructed from any suitable material that enables the system 100 to function as described herein, including, for example, silica-coated graphite, high purity molybdenum, and combinations thereof.

The pulling mechanism 118 generally includes a pull cable 140, a seed holder or chuck 142 connected to one end of pull cable 140, and the seed crystal 122 secured to the seed holder or chuck 142 for initiating crystal growth. The pull cable 140 is connected to a suitable lift or motor to pull the pull cable 140, along with the chuck 142, the seed crystal 122, and the ingot 116, generally upward along a pull axis. The pulling mechanism 118 is also configured to rotate the seed crystal 122 to facilitate uniform crystal growth.

The heaters 120 are configured to melt an initial charge of solid feedstock (such as chunk polysilicon), and maintain the melt 114 in a liquefied state after the initial charge is melted. The heaters are arranged at suitable locations about the crucible 112. In the illustrated embodiment, one of the heaters 120 is positioned beneath the crucible 112 and the susceptor 108, and another heater 120 is positioned radially outward from and extends around a sidewall of the crucible 112. In the illustrated embodiment, each heater 120 has a generally annular shape, although the heaters 120 may have any suitable shape that enables the crystal pulling system 100 to function as described herein. In the example embodiment, the heaters 120 are resistive heaters, although the heaters 120 may be any suitable heating device that enables the system 100 to function as described herein. Further, while the illustrated embodiment is shown and described as including two heaters 120, the system 100 may include any suitable number of heaters that enables the system 100 to function as described herein. The crystal pulling system 100 also includes insulation 144 positioned radially outward from and extending around the heater 120 to prevent heat loss from within the growth chamber 104.

The crystal pulling system 100 may also include a controller (not shown in FIG. 1) communicatively connected to various components of the system 100, such as the rotatable shaft 110 (or a motor connected to the shaft 110) the pulling mechanism 118, and the heaters 120, for controlling operation of such components.

The gas inlet 126 of this embodiment is disposed on the dome 134 of the housing 102, and is configured to introduce an inert gas into the growth chamber from above a surface of the melt 114. In other embodiments, the gas inlet 126 may be disposed on other portions of the housing 102, such as the elongate tubular portion 136. The illustrated embodiment includes a single gas inlet 126, although other embodiments may include more than one gas inlet 126. The gas inlet 126 is fluidly connected to a gas supply source. Suitable source gases include, for example and without limitation, inert gases, such as argon, helium, nitrogen, and mixtures thereof.

As depicted by arrows 146, gas introduced through the gas inlet 126 flows generally downward through the growth chamber 104, across a surface of the melt 114 and between the melt 114 and the heat shield 124. The gas then flows upward and over a sidewall of the crucible 112, and then downward along a flow path disposed outward from the crucible 112 and susceptor 108 to the exhaust outlet 128.

The exhaust outlet 128 is disposed on the lower portion 130 of the housing, proximate the heater 120 positioned radially outward from the crucible 112. The exhaust outlet 128 is connected in fluid communication with a vacuum pump (not shown in FIG. 1) via the exhaust tube 200. The vacuum pump is configured to create a low pressure or suction at the exhaust outlet 128 to remove inert gas, airborne contaminants, and other gaseous products (e.g., SiO, CO) from the growth chamber 104.

The crystal pulling system 100 of this embodiment also includes a flow guide 148 configured to direct gases radially outward from growth chamber 104 to exhaust outlet 128. The flow guide 148 includes an inlet end 150 disposed radially inward from the heater 120, and an outlet end 152 positioned adjacent the exhaust outlet 128 and exhaust tube 200. The flow guide 148 is constructed from the same or similar materials as susceptor, and is configured to maintain exhaust gases at an elevated temperature prior to reaching the fluid-cooled exhaust tube 200. Suitable materials from which flow guide 148 may be constructed include, for example and without limitation, carbon compounds such as graphite.

Figure 2:
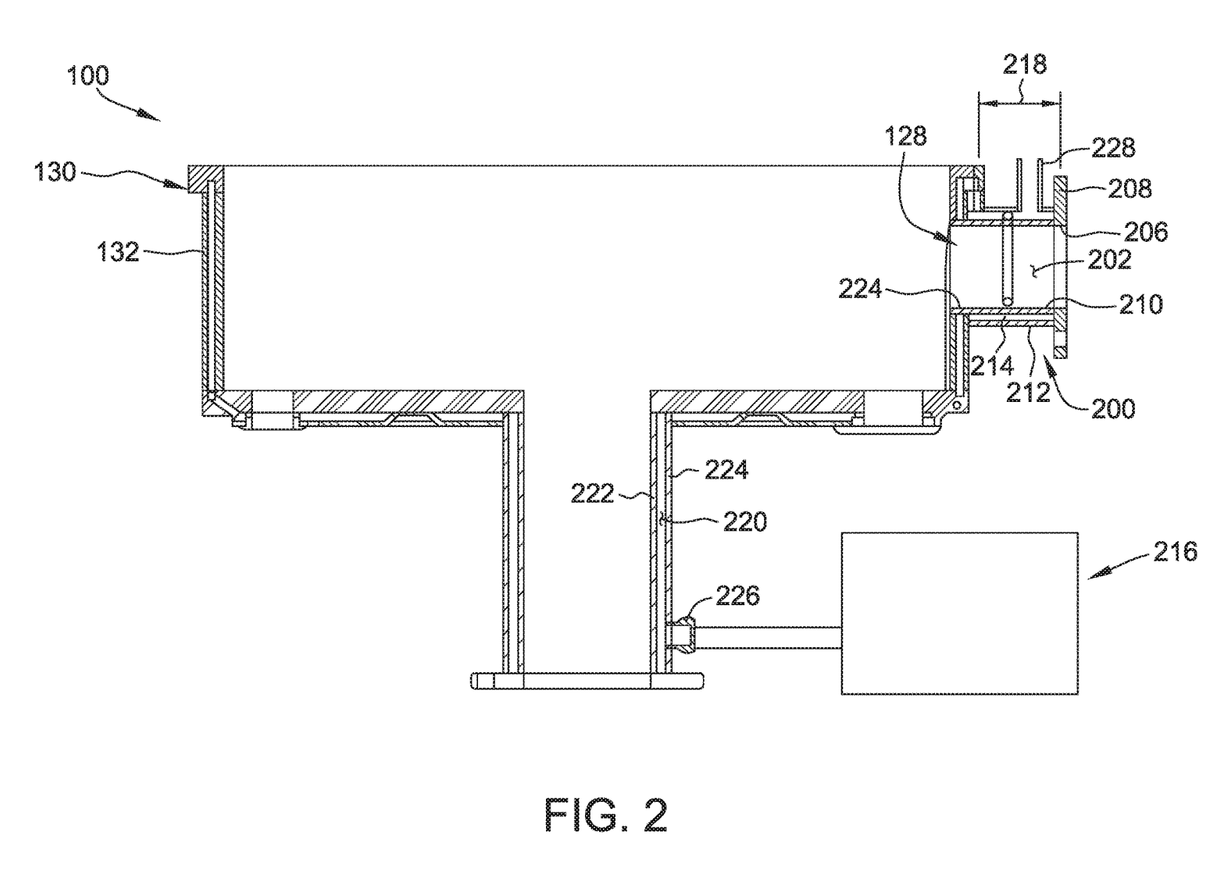
FIG. 2 is an enlarged view of a portion of the crystal pulling system of FIG. 1.

FIG. 2 is an enlarged cross-sectional view of a portion of the crystal pulling system 100 illustrating details of the fluid-cooled exhaust tube 200. Portions of the crystal pulling system 100 shown in FIG. 1 are omitted from FIG. 2 for clarity. As shown in FIG. 2, the exhaust tube 200 extends radially outward from the sidewall 132 of the housing 102, and defines an exhaust flow path 202 through which exhaust gases are discharged from the growth chamber 104. In the illustrated embodiment, the exhaust outlet 128 and exhaust tube 200 are positioned proximate the heater 120 disposed radially outward from the crucible 112 (shown in FIG. 1) to reduce a gas flow path distance between the heater 120 and the exhaust outlet 128 to maintain exhaust gases at an elevated temperature prior to reaching the exhaust outlet 128.

Figure 3:
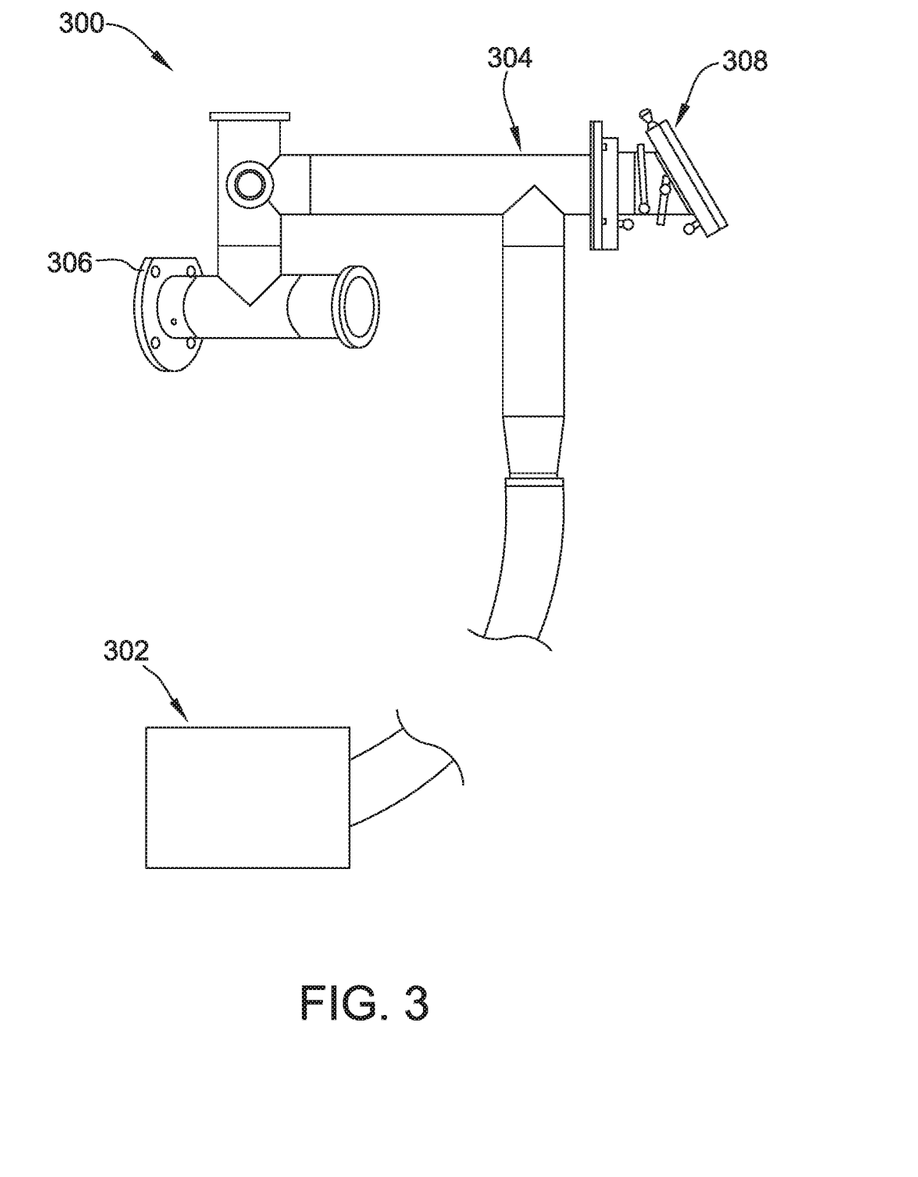
FIG. 3 is a partially schematic view of a vacuum system suitable for use with the crystal pulling system of FIG. 1.

The exhaust tube 200 includes a first end 204 connected to the lower portion 130 of the housing 102 adjacent the exhaust outlet 128, and a second, distal end 206 including a flanged portion 208 for connection to a vacuum system 300, shown in FIG. 3. The exhaust tube 200 also includes a radial inner wall 210 and a radial outer wall 212 each extending from the first end 204 to the second end 206. A first fluid passage 214 is defined between the inner wall 210 and the outer wall 212. The first fluid passage 214 is configured to receive fluid, such as water, for cooling exhaust gases within the exhaust flow path 202.

The inner wall 210 is constructed of suitable thermally conductive materials to facilitate heat exchange between the cooling fluid and exhaust gases within the exhaust flow path 202. Suitable materials from which the inner wall 210 may be constructed include, for example and without limitation, stainless steel. In some embodiments, the inner wall 210 is constructed of the same materials as the housing 102. The outer wall 212 may be constructed of the same materials as the inner wall 210, or may be constructed of materials different than the inner wall 210.

The first fluid passage 214 is connected in fluid communication with a fluid supply source 216 for supplying cooling fluid to the first fluid passage 214. The cooling fluid may be any suitable fluid that enables the system 100 to function as described herein, including, for example and without limitation, water. The flow rate of cooling fluid through the first fluid passage 214 may be controlled to increase or decrease the cooling rate of exhaust gases within the exhaust flow path. In some embodiments, the flow rate of the cooling fluid through the first fluid passage 214 is between about 80 liters per minute (L/min) and about 120 L/min, and, more suitably, is about 100 L/min. The fluid supply source 216 may be connected to suitable flow control components, such as pumps and flow controllers (not shown) for controlling the flow rate of fluid through the first fluid passage 214.

As shown in FIG. 2, the exhaust tube 200 extends a length 218 outward from the sidewall 132 of the housing 102. In the illustrated embodiment, the exhaust tube 200 is fluid-cooled over the entire length 218, although in other embodiments, the exhaust tube 200 may be fluid-cooled over only a portion of the length 218. In some embodiments, the exhaust tube 200 is fluid-cooled over at least 5 cm of the length 218 and more suitably over at least 10 cm of the length 218. In some embodiments, the exhaust tube 200 is fluid-cooled over 20 cm of the length 218.

The first fluid passage 214 shown in FIG. 2 is connected to the fluid supply source 216 via a second fluid passage 220 defined by the housing 102. Specifically, the second fluid passage 220 is defined between an inner wall 222 of the housing 102 and an outer wall 224 of the housing 102. The housing 102 includes a fluid inlet 226 connected to the fluid supply source 216 via suitable conduits. Cooling fluid is introduced into the second fluid passage 220 through the fluid inlet 226.

The exhaust tube 200 includes a fluid outlet 228 through which fluid is discharged from the first fluid passage 214. Fluid discharged through the fluid outlet 228 may be directed to other fluid passages for cooling other portions of the housing 102, or may be directed back to the fluid supply 216 for recirculation.

FIG. 3 is a side view of a vacuum system 300 suitable for use with the crystal pulling system 100 shown in FIGS. 1 and 2. The vacuum system 300 generally includes a vacuum pump 302 and a vacuum connector 304 for connecting the exhaust tube 200 to the vacuum pump 302. The vacuum connector 304 includes a flanged portion 306 configured to engage the flanged portion 208 of the exhaust tube 200 to form a sealed, fluid connection between the exhaust tube 200 and the vacuum pump 302. In use, the vacuum connector 304 is connected to the exhaust tube 200, and the vacuum pump 302 is used to establish a reduced pressure at the exhaust outlet 128 to draw exhaust gases out of the growth chamber 104 through the exhaust flow path 202. In the illustrated embodiment, the vacuum system 300 also includes an over-pressure valve 308 connected to the vacuum connector 304. The over-pressure valve 308 is normally in a closed position, and is configured to open when a pressure differential between the vacuum system 300 and the surrounding environment exceeds a threshold pressure differential.

Referring to FIGS. 1-3, the crystal pulling system 100 is suitably used to grow monocrystalline ingots from the melt 114 according to the Czochralski method. More specifically, the melt 114 is prepared in the crucible 112 by charging the crucible 112 with feedstock material, such as chunk polycrystalline silicon. The feedstock material is melted in the crucible 112 using heaters 120 to form the melt 114 of semiconductor or solar-grade material. Once the feedstock material is sufficiently melted, the seed crystal 122 is lowered into contact with the melt 114 by the pulling mechanism 118 to initiate crystal growth, and a monocrystalline ingot is grown from the melt 114 by subsequently pulling the seed crystal 122 away from the melt. During the growth process, inert gas, such as argon, is introduced into the growth chamber 104 through the gas inlet 126, and is directed generally downward, along the surface of the melt 114 and to the exhaust outlet 128. The vacuum system 300 establishes a negative or reduced pressure at the exhaust outlet 128 to draw exhaust gases (e.g., inert gas and gaseous species generated by the melt 114 and/or other components of the system 100) out of the growth chamber 104 through the exhaust flow path 202.

As the exhaust gases flow through the exhaust flow path 202, the fluid-cooled exhaust tube 200 rapidly cools the exhaust gases. In particular, a cooling fluid is directed through the first fluid passage 214 defined by the inner wall 210 and the outer wall 212 of the exhaust tube 200 to cause a heat exchange between the exhaust gases and the cooling fluid.

Without being bound by any particular theory, it is believed that rapidly cooling the exhaust gases, as opposed to maintaining exhaust gases at an elevated temperature, results in the formation of precipitates having a powder-like structure or morphology that does not adhere to surfaces of the exhaust tube as strongly as precipitates formed at higher temperatures (e.g., near a condensation or precipitation temperature). As a result, precipitates formed within the fluid-cooled exhaust tube 200 have a tendency to not aggregate or build-up within the exhaust flow path, allowing crystal growth processes to be carried out for extended periods of time.

Figure 4:
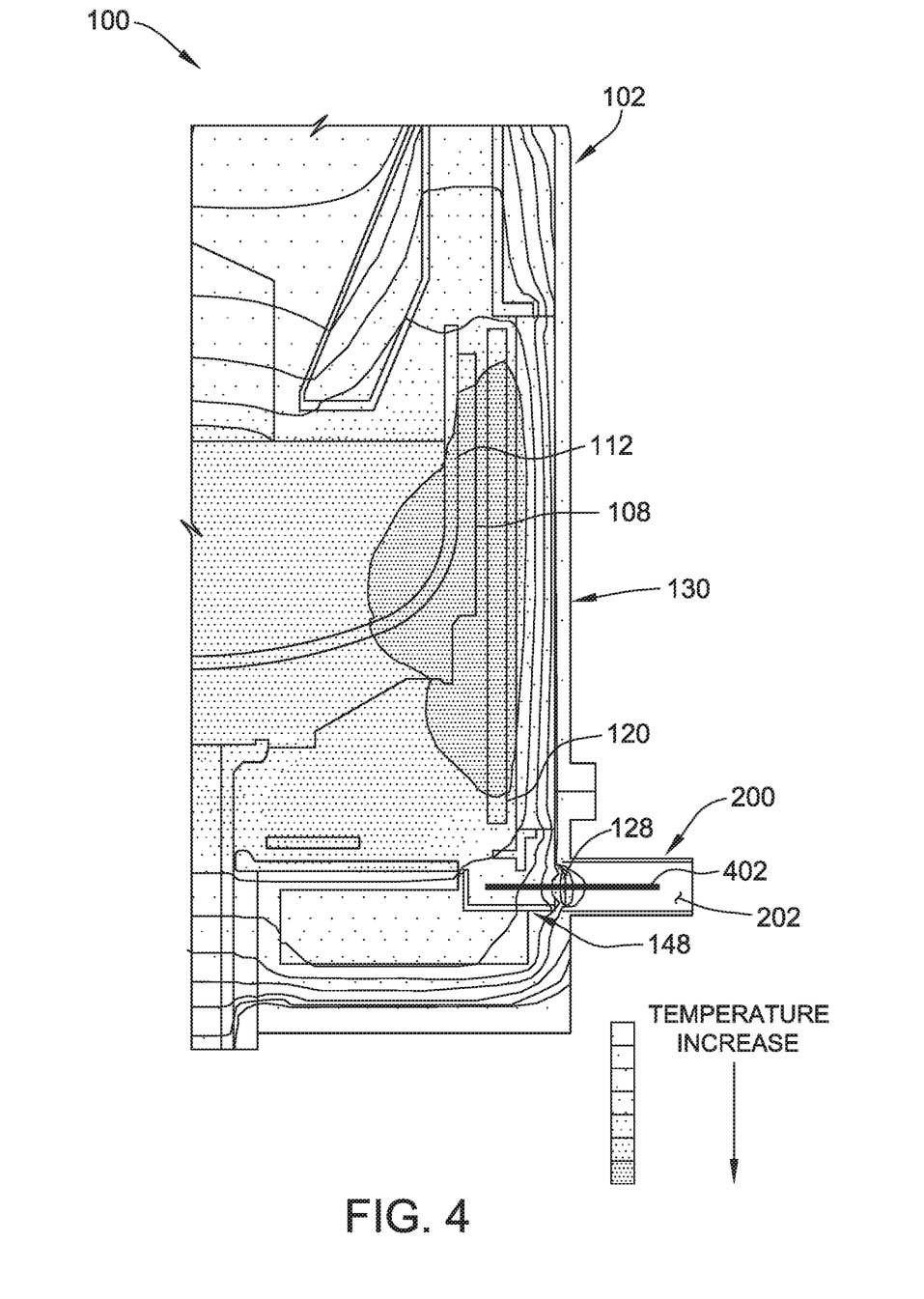
FIG. 4 is a temperature contour plot of a portion of the crystal pulling system.
Figure 5:
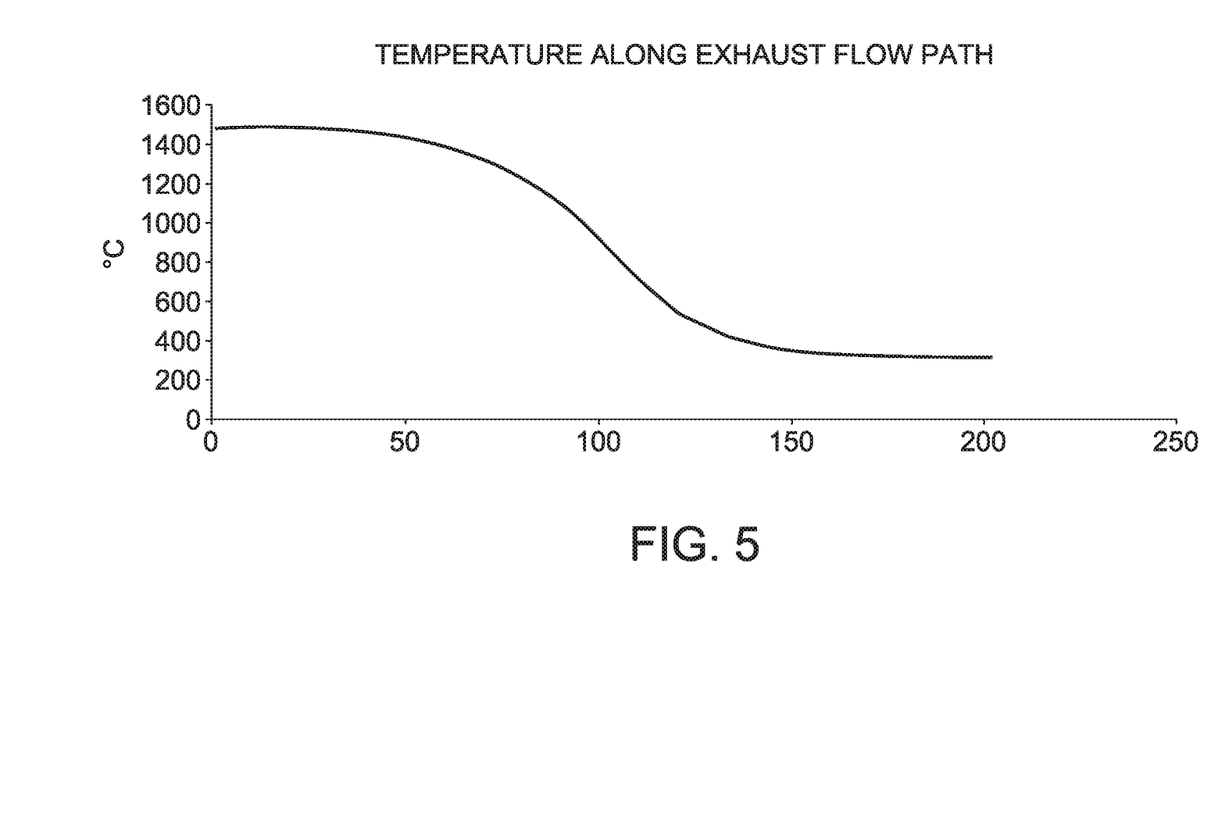
FIG. 5 is a plot of the temperature of exhaust gases along the length of an exhaust flow path in the crystal pulling system.

FIG. 4 is a temperature contour plot of a portion of the crystal pulling system 100 shown in FIG. 1. FIG. 5 is a plot of the temperature of exhaust gases within the exhaust flow path over a certain portion of the exhaust flow path, indicated at 402 in FIG. 4. As shown in FIGS. 4 and 5, the fluid-cooled exhaust tube 200 establishes a large temperature gradient along the exhaust flow path 202. In some embodiments, the temperature gradient established across the exhaust outlet 128 and/or along the exhaust flow path 202 is at least 50° C./cm, at least 100° C./cm, at least 150° C./cm, at least 200° C./cm, and even up to about 250° C./cm. In some embodiments, the temperature gradient is between about 100° C./cm and about 200° C./cm.

The crystal pulling systems and methods described herein provide several advantages over known crystal pulling systems and methods. In particular, crystal pulling systems and methods described herein facilitate increasing the run time of Czochralski crystal pulling processes by reducing and/or preventing the build-up of deposits and precipitates within the exhaust tube of crystal pulling systems. More specifically, embodiments disclosed herein include a fluid-cooled exhaust tube that rapidly cools exhaust gases as they pass through the exhaust tube. Rapidly cooling exhaust gases, as opposed to maintaining exhaust gases at an elevated temperature, results in the formation of precipitates having a powder-like structure or morphology that does not adhere to surfaces of the exhaust tube as strongly as precipitates formed at higher temperatures (e.g., near a condensation or precipitation temperature). As a result, precipitates formed within the fluid-cooled exhaust tubes of the present disclosure have a tendency to not aggregate or build-up within the exhaust flow path, allowing crystal growth processes to be carried out for extended periods of time.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A crystal pulling system for growing a monocrystalline ingot from a melt of semiconductor or solar-grade material, the system comprising:
   a housing defining a growth chamber;
   a crucible disposed within the growth chamber for containing the melt of semiconductor or solar-grade material;
   an exhaust tube connected to and extending outward from a sidewall of the housing and defining an exhaust flow path for discharging gaseous products from the growth chamber;
   a vacuum pump connected in fluid communication with the exhaust tube and configured to draw exhaust gases through the exhaust flow path; and
   a flow guide configured to direct exhaust gases from the growth chamber to the exhaust tube and to maintain exhaust gases at an elevated temperature prior to reaching the exhaust tube, wherein the flow guide has an inlet and an outlet and is positioned in a lower portion of the growth chamber proximate the exhaust tube such that the inlet is positioned below the crucible,
   a heater disposed radially outward from and extending around the crucible, wherein the inlet is positioned radially inward from the heater and the outlet is positioned proximate the exhaust tube,
   wherein the exhaust tube includes an inner wall, an outer wall, and a fluid passage defined between the inner wall and the outer wall, the fluid passage configured to receive fluid for cooling exhaust gases within the exhaust flow path.

2. The crystal pulling system of claim 1, wherein the flow guide is constructed of graphite.

3. The crystal pulling system of claim 1, wherein the exhaust tube includes a flanged portion located at an end of the tube distal from the housing, the flanged portion configured for connection with a vacuum connector.

4. The crystal pulling system of claim 3 further including a vacuum connector having a flanged portion connected to the flanged portion of the exhaust tube.

5. The crystal pulling system of claim 1, wherein the fluid passage is a first fluid passage, the housing defining a second fluid passage configured to receive fluid for cooling the housing, wherein the first fluid passage is connected in fluid communication with the second fluid passage, the first fluid passage positioned proximate the sidewall.

6. The crystal pulling system of claim 5, wherein the housing includes a lower portion having a fluid inlet defined therein for introducing fluid into the second fluid passage, the exhaust tube defining a fluid outlet for discharging fluid from the first fluid passage, the fluid outlet positioned proximate the sidewall.

7. The crystal pulling system of claim 1, wherein the exhaust tube has a length extending outward from the sidewall, wherein the exhaust tube is fluid cooled over at least 5 cm of the length.

8. The crystal pulling system of claim 7, wherein the exhaust tube is fluid cooled over at least 10 cm of the length.

9. The crystal pulling system of claim 1 including a pull mechanism configured to pull a monocrystalline ingot from the melt.

10. The crystal pulling system of claim 1 including a heat shield disposed within an upper portion of the growth chamber and configured to shield the monocrystalline ingot as it is pulled from the melt.

11. A crystal pulling system for growing a monocrystalline ingot from a melt, the system comprising:
    a housing defining a growth chamber;
    a crucible disposed within the growth chamber for containing the melt;
    a vacuum pump configured to draw exhaust gases out of the growth chamber;
    a fluid-cooled exhaust tube connected in fluid communication between the growth chamber and the vacuum pump;
    a flow guide configured to direct exhaust gases from the growth chamber to the exhaust tube and to maintain exhaust gases at an elevated temperature prior to reaching the exhaust tube, wherein the flow guide has an inlet and an outlet and is positioned in a lower portion of the housing proximate the exhaust tube such that the inlet is positioned below the crucible; and
    a heater disposed radially outward from and extending around the crucible, wherein the inlet is positioned radially inward from the heater and the outlet is positioned proximate the exhaust tube.

12. The crystal pulling system of claim 11, wherein the exhaust tube has a length extending outward from the sidewall, wherein the exhaust tube is fluid cooled over at least 5 cm of the length.

13. The crystal pulling system of claim 12, wherein the exhaust tube is fluid cooled over at least 10 cm of the length.

14. The crystal pulling system of claim 11 including a pull mechanism configured to pull a monocrystalline ingot from the melt.

15. The crystal pulling system of claim 11 including a heat shield disposed within an upper portion of the growth chamber and configured to shield the monocrystalline ingot as it is pulled from the melt.

16. A method of growing a monocrystalline ingot of semiconductor or solar-grade material in a crystal growing system including a housing defining a growth chamber and a crucible disposed within the growth chamber for containing a melt of semiconductor or solar-grade material, the crystal growing system also includes a heater disposed radially outward from and extending around the crucible, the method including:
    preparing the melt in the crucible;
    introducing an inert gas into the growth chamber;
    directing the inert gas through the growth chamber to remove gaseous products generated within the growth chamber;
    directing the gaseous products through a flow guide positioned in a lower portion of the housing proximate an exhaust tube such that an inlet of the flow guide is positioned below the crucible and radially inward from the heater and the outlet is positioned proximate an exhaust tube, wherein the flow guide maintains an elevated temperature of the gaseous product prior to reaching the exhaust tube;
    discharging the gaseous products through the exhaust tube connected to and extending outward from a sidewall of the housing; and
    cooling the gaseous products as the gaseous products flow through the exhaust tube.

17. The method of claim 16, wherein cooling the gaseous products includes directing a fluid through a fluid passage defined within the exhaust tube.

18. The method of claim 16, wherein the exhaust tube defines an exhaust flow path, wherein the method further includes establishing a temperature gradient along the exhaust flow path of at least 50° C./cm.

19. The method of claim 18 further including establishing a temperature gradient along the exhaust flow path of at least 100° C./cm.

20. The method of claim 18 further including establishing a temperature gradient along the exhaust flow path of at least 150° C./cm.

21. The method of claim 18 further including establishing a temperature gradient along the exhaust flow path of between 100° C./cm and 200° C./cm.

* * * * *